(12) United States Patent
Hu et al.

(10) Patent No.: US 6,198,535 B1
(45) Date of Patent: *Mar. 6, 2001

(54) WAFER ALIGNMENT SYSTEM

(75) Inventors: Fa-Fu Hu, Hsinchu; Yu-Chung Hung, Kaohsiung; Chih-Jen Chang, Hsinchu, all of (TW)

(73) Assignee: United Integrated Circuits Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/191,328

(22) Filed: Nov. 13, 1998

(30) Foreign Application Priority Data

Aug. 20, 1998 (TW) ................................. 87113704

(51) Int. Cl.⁷ ..................................................... G01B 11/00
(52) U.S. Cl. ........................................... 356/401; 356/399
(58) Field of Search ..................................... 356/399, 401

(56) References Cited

U.S. PATENT DOCUMENTS

| 4,652,134 | * | 3/1987 | Pasch et al. | 356/401 |
| 4,952,060 | * | 8/1990 | Ina et al. | 356/407 |
| 5,847,190 | * | 2/1999 | Tanaka | 430/22 |
| 5,929,997 | * | 7/1999 | Lin | 356/401 |

* cited by examiner

*Primary Examiner*—Peter J. Font
*Assistant Examiner*—Philip S. Natividad
(74) *Attorney, Agent, or Firm*—Jiawei Huang; J C Patents

(57) ABSTRACT

A wafer alignment system aligns a wafer by checking the alignment marks formed on the back surface of the wafer. A number of guiding rays are used to determine the corresponding alignment mark on the back of the wafer to ensure that the wafer is properly aligned. The alignment system of the invention also includes a wafer stage and a fixed base, wherein the wafer stage and the fixed base contains a number of apertures that allow the guiding rays to pass through and strike on the alignment marks on the wafer.

5 Claims, 2 Drawing Sheets

WAFER ALIGNMENT SYSTEM

CROSS-REFERENCE TO RELATED APPLICATION

This application claims the priority benefit of Taiwan application serial no. 87113704, filed Aug. 20, 1998, the full disclosure of which is incorporated herein by reference.

BACKGROUND OF THE INVENTION

1. Field of the Invention

This invention relates to a semiconductor fabrication process, and more particularly to an alignment system for performing an alignment process on a wafer.

2. Description of Related Art

Among the processes for fabricating a semiconductor device, photolithography is one of the most critical processes since it is directly related to the accuracy of transferring a pattern on to the desired region. Generally, the fabrication of a semiconductor device requires about 10 to 18 masks, that is, performing the same number of photolithography processes.

Before a pattern is transferred onto a desired surface, an alignment process has to be done to ensure the accuracy of patterning. Normally at least two alignment marks are formed on the surface of a wafer to be patterned in order to set the wafer on a correct position. However, various fabricating processes performed on the wafer, such as chemical mechanical polishing, cause damage on the alignment marks, and that further results in a poor alignment and an erroneous pattern transfer.

Referring to FIG. 1 is a schematic diagram showing a conventional method for aligning a wafer 14. Referring to FIG. 1, the wafer 14, which has a top surface 13 and a back surface 15, is placed on a wafer stage 12, wherein the top surface 13 of the wafer 14, contains two alignment marks W1 and W2. The wafer stage 12 is located on a fixed base 10.

The alignment process starts with emitting a guiding ray from an illumination case 16. The guiding ray is firstly reflected by mirrors 18 and 20, and then the reflected guiding ray falls onto one of the alignment marks W1 and W2. The guiding ray is then reflected to a reticle 32 through a projection lens 30 by the wafer, wherein the reticle 32 contains marks M1 and M2. Two alignment blocks 34 and 36 are used to confirm the condition of a valid alignment is obtained. The condition of a valid alignment includes that the reflected guiding ray strikes on the marks M1 and M2.

Because most fabrication processes physically change the top surface 13 of the wafer 14, the alignment marks W1 and W2 are deformed and maculed. The physical damages on the alignment marks lead to a poor alignment, poor pattern transfer, or even resulting in abandoning a wafer.

SUMMARY OF THE INVENTION

It is therefore an objective of the present invention to provide an alignment system that protects the alignment marks on a wafer from being damaged by other fabrication processes to ensure the quality of alignment and the follow-up processes.

In accordance with the foregoing and other objectives of the present invention, the invention provides an alignment system that aligns a wafer by checking the alignment marks formed on the back surface of the wafer. A number of guiding rays are used to determine the corresponding alignment mark on the back of the wafer to ensure that the wafer is properly aligned.

The alignment system of the invention also includes a wafer stage and a fixed base, wherein the wafer stage and the fixed base contain a number of apertures that allow the guiding rays to pass through and strike on the alignment marks on the wafer.

BRIEF DESCRIPTION OF DRAWINGS

The invention can be more fully understood by reading the following detailed description of the preferred embodiments, with reference made to the accompanying drawings wherein.

DETAILED DESCRIPTION OF PREFERRED EMBODIMENTS

The invention provides a new alignment system that includes an alignment unit, a wafer supporting unit, and a wafer with alignment marks formed on its back surface. The alignment system of the invention is shown in FIG. 2.

Figure 1:
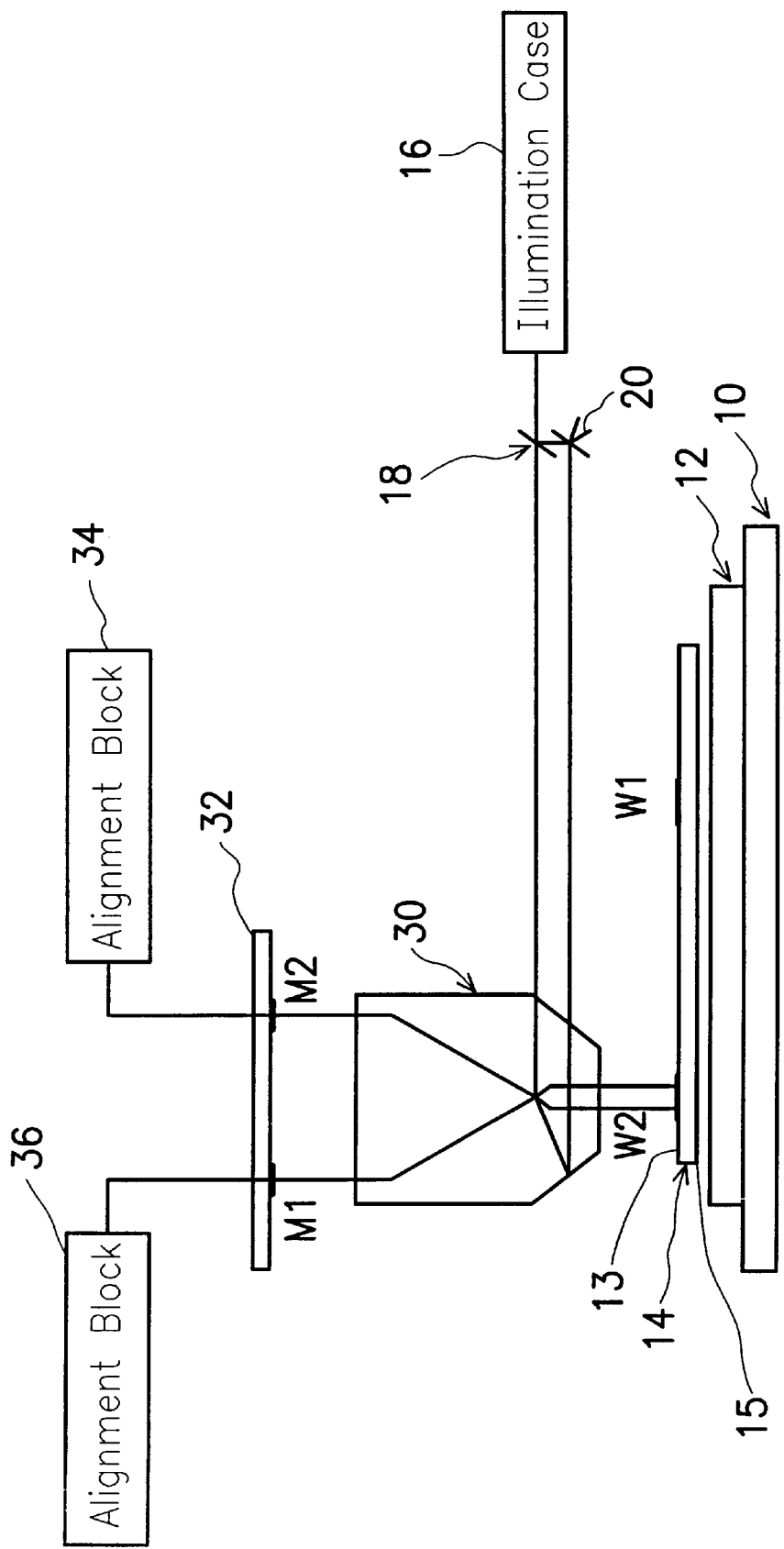
FIG. 1 is a schematic diagram showing a conventional alignment system and a wafer.
Figure 2:
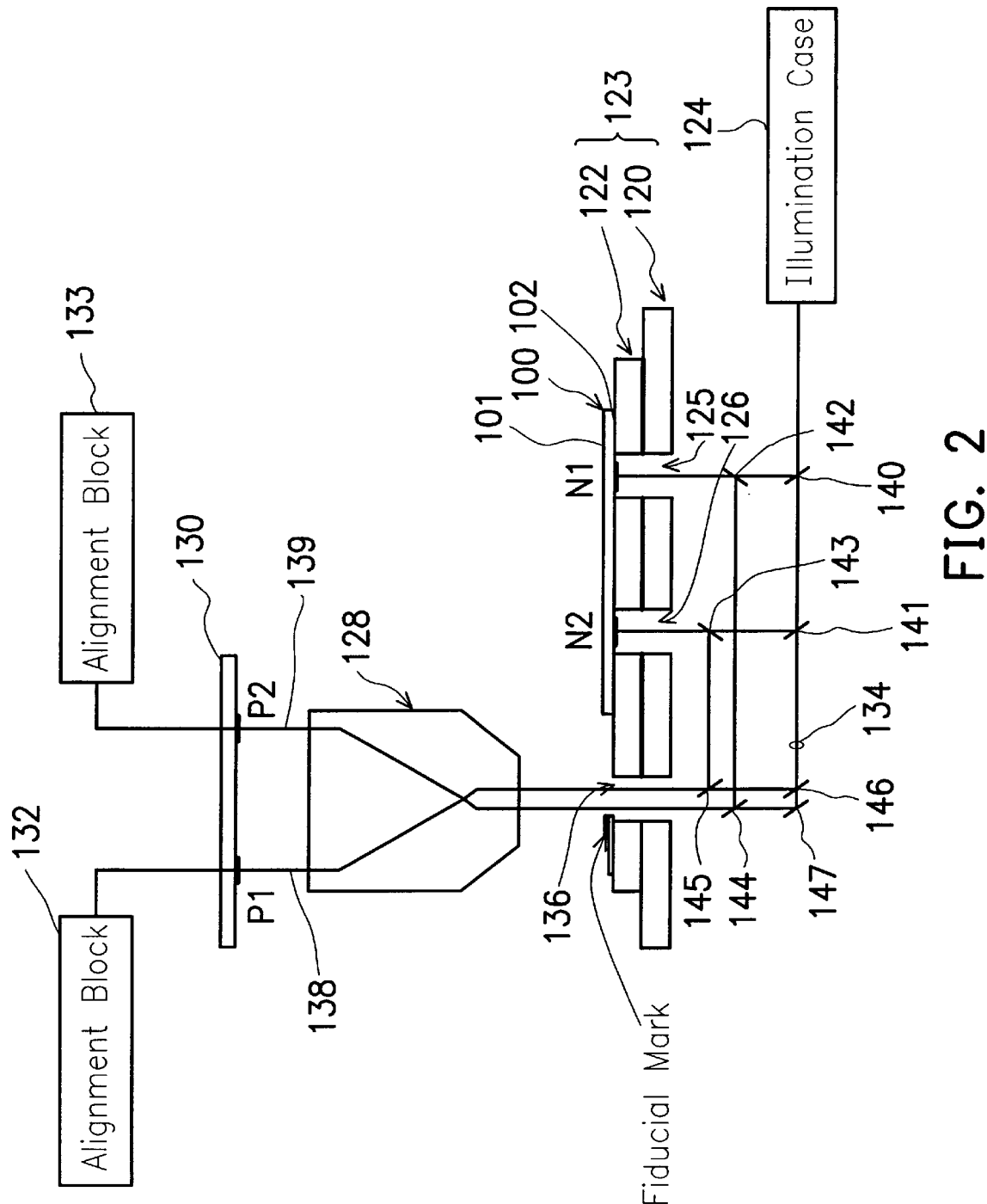
FIG. 2 is a schematic diagram showing the alignment system of the invention and the wafer that has alignment marks on its back surface.

Referring to FIG. 2, a wafer 100 contains a first surface 101 and a second surface 102, wherein the second surface 102 includes a number of alignment marks, for example, two alignment marks N1 and N2 as shown in the figure. The first surface 101 of the wafer is reserved for transferring patterns of forming metal-oxide-semiconductor devices, such as transistors.

The wafer 100 is placed on the wafer-supporting unit 123 including a wafer stage 122 and a fixed base 120. A part of the wafer alignment unit includes an illumination case 124, mirrors 140 to 147 and a shutter 134 are set under the wafer supporting unit 123. The wafer supporting unit 123 contains a number of apertures, for example, 125 and 126 in the figure, that allow alignment rays pass through to strike on the wafer 100. The locations of the apertures 125 and 126 are right below the locations of the alignment marks N1 and N2 on the second surface 102 of the wafer 100.

The wafer alignment unit includes the illumination case 124, a number of mirrors 140 through 147. projection lens 128, a reticle 130, and alignment blocks 132 and 133.

When an alignment process is performed, a number of guiding rays come out from the illumination case 124 firstly, wherein the number of the guiding rays is the same as the number of the alignment marks on the wafer 100, two in this preferred embodiment of the invention. In the presence of the mirrors 140 and 141, the guiding rays are reflected respectively onto the alignment marks N1 and N2 on the second surface 102 of the wafer 100 through the apertures 125 and 126. It is not necessary for the guiding rays to overlay on each other. Since FIG. 2 is a side view of the wafer alignment system of the invention, the longitudinal relationship between the guiding rays is not shown in figure.

The guiding rays are then reflected by the alignment marks N1 and N2 to pass through the apertures 125 and 126 again, and fall on mirrors 142 and 143 respectively. The paths of the guiding rays that are reflected by the alignment marks N1 and N2 are different from the paths of the incident guiding rays (not shown in figure). The guiding rays are again reflected respectively by the mirrors 142 and 143 this time, to mirrors 144 and 145. In the presence of the mirrors 144 and 145, the guiding rays are reflected respectively to pass the fiducial mark 136 on the wafer supporting unit 123, and then reach the marks P1 and P2 on the reticle 130 through the projection lens 128. A number of alignment blocks, 132 and 133 in this preferred embodiment of the invention, are then used to check if the guiding rays strike on a number of marks, P1 and P2, to ensure the accuracy of alignment. The number of alignment blocks and the number of marks are the same as the number of the alignment marks.

The alignment unit of the wafer alignment system according to the invention further includes a shutter 134, and mirrors 146 and 147 for resetting the system. Before a wafer is placed on the wafer-supporting unit 123, the shutter 134 is opened to allow a number of guiding rays passing through, wherein the number of guiding rays used for resetting the system is the same as the number of alignment marks. The guiding rays firstly reflected by mirrors 146 and 147, and then projected by the projection lens 128 to strike on the marks P1 and P2. The alignment blocks 132 and 133 then check the projected guiding rays, 138 and 139, to ensure that the system is properly set. The shutter 134 is closed after the system is reset.

The wafer alignment system according to the invention aligns a wafer by forming and checking alignment marks on the back surface of the wafer to prevent the damages on the alignment marks caused by fabrication processes. Hence, the accuracy of patterning process is improved.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A wafer alignment system for alignment of a wafer, wherein the wafer comprises a first surface and a second surface, and wherein the first surface is reserved for transferring a pattern thereon, and the second surface comprises a plurality of alignment marks, the wafer alignment system comprising:

a wafer supporting-unit for supporting the wafer on its second surface, wherein the wafer supporting unit comprises a plurality of apertures, and wherein the apertures are located correspondingly to the alignment marks, and the wafer supporting-unit also comprises a fiducial mark used for setting the wafer supporting-unit to a reference location in which the fiducial mark and the wafer have no overlap; and an alignment unit for emitting a plurality of guiding rays, and aligning the wafer by checking the guiding rays, wherein the guiding rays are reflected by the alignment marks right above the apertures before being checked.

2. The wafer alignment system of claim 1, wherein the wafer-supporting unit comprises:

a wafer stage for supporting the wafer on the second surface of the wafer; and a fixed base coupled with the wafer stage.

3. The wafer alignment system of claim 1, wherein the alignment unit comprises:

a illumination case for emitting guiding rays;

a plurality of mirrors for reflecting the guiding rays to the alignment marks and then to a projection lens;

a reticle comprising a plurality of marks for receiving the guiding rays;

a projection lens for projecting the guiding rays to the reticle; and a plurality of alignment blocks for checking the guiding rays.

4. The wafer alignment system of claim 3, wherein the alignment system further comprises a shutter for controlling the guiding rays to reset the wafer alignment system.

5. The wafer alignment system of claim 1, wherein a quantity of the alignment marks is two.

* * * * *